United States Patent
Chiang et al.

(10) Patent No.: US 9,368,610 B2
(45) Date of Patent: Jun. 14, 2016

(54) HIGH ELECTRON MOBILITY TRANSISTOR WITH INDIUM NITRIDE LAYER

(71) Applicant: TAIWAN SEMICONDUCTOR MANUFACTURING COMPANY, LTD., Hsinchu (TW)

(72) Inventors: Chen-Hao Chiang, Jhongli (TW); Po-Chun Liu, Hsinchu (TW); Chi-Ming Chen, Zhubei (TW); Min-Chang Ching, Zhubei (TW); Chung-Yi Yu, Hsinchu (TW); Chia-Shiung Tsai, Hsinchu (TW); Ru-Liang Lee, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/931,009

(22) Filed: Nov. 3, 2015

(65) Prior Publication Data

US 2016/0071969 A1 Mar. 10, 2016

Related U.S. Application Data

(62) Division of application No. 14/182,885, filed on Feb. 18, 2014, now Pat. No. 9,202,875.

(51) Int. Cl.
| | | |
|---|---|---|
| *H01L 29/778* | (2006.01) |
| *H01L 29/20* | (2006.01) |
| *H01L 29/45* | (2006.01) |
| *H01L 29/66* | (2006.01) |
| *H01L 23/31* | (2006.01) |
| *H01L 33/00* | (2010.01) |
| *H01L 29/205* | (2006.01) |
| *H01L 31/18* | (2006.01) |

(52) U.S. Cl.
CPC ........ *H01L 29/7787* (2013.01); *H01L 23/3171* (2013.01); *H01L 29/2003* (2013.01); *H01L 29/205* (2013.01); *H01L 29/452* (2013.01); *H01L 29/66431* (2013.01); *H01L 29/66462* (2013.01); *H01L 31/1848* (2013.01); *H01L 33/002* (2013.01); *H01L 33/0025* (2013.01); *H01L 2924/10323* (2013.01); *H01L 2924/10344* (2013.01)

(58) Field of Classification Search
CPC .............. H01L 23/3171; H01L 29/452; H01L 29/66431; H01L 29/66462; H01L 29/7786; H01L 29/7787; H01L 31/1848; H01L 33/002; H01L 33/0025; H01L 2924/10323; H01L 2924/10344; H01L 2924/13064
See application file for complete search history.

(56) References Cited

U.S. PATENT DOCUMENTS

| | | | |
|---|---|---|---|
| 2011/0057232 A1 | 3/2011 | Sheppard et al. | |
| 2013/0240951 A1* | 9/2013 | Bedell | H01L 29/66462 257/194 |

*Primary Examiner* — Thanhha Pham
(74) *Attorney, Agent, or Firm* — Hauptman Ham, LLP

(57) ABSTRACT

A semiconductor device includes a substrate, a first layer over the substrate, a second layer over the first layer, and a third layer over the second layer. The third layer has a first portion and a second portion. The first portion of the third layer is separated from the second portion of the third layer. The semiconductor device also includes a first blended region beneath the first portion of the third layer. The first blended region includes aluminum atoms drawn from the first layer into at least the second layer. The semiconductor device further includes a second blended region beneath the second portion of the third layer. The second blended region includes aluminum atoms drawn from the first layer into at least the second layer. The semiconductor device also includes a source contact and a drain contact.

20 Claims, 3 Drawing Sheets

HIGH ELECTRON MOBILITY TRANSISTOR WITH INDIUM NITRIDE LAYER

PRIORITY CLAIM

The present application is a divisional of U.S. patent application Ser. No. 14/182,885, filed Feb. 18, 2014, which is incorporated herein by reference in its entirety.

BACKGROUND

Device manufacturers are challenged to deliver value and convenience to consumers by, for example, providing integrated circuits that provide quality performance. The performance capabilities of some integrated circuits are limited because of a resistance that exists between source and/or drain contacts, and one or more semiconductor layers of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
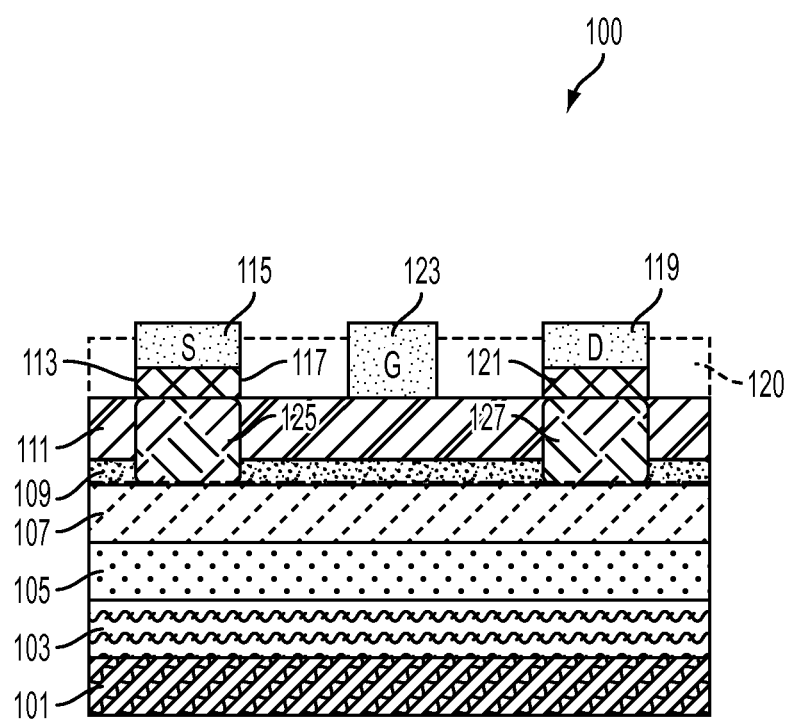
FIG. 1 is a cross-section view of a semiconductor device with a low band gap material beneath a source contact and a drain contact of the semiconductor device, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Semiconductor devices such as, but not limited to, high electron mobility transistors (HEMT's) often comprise a source contact, a drain contact, a substrate, and a plurality of layers between the source contact, the drain contact, and the substrate. Among these layers, some semiconductor devices include one or more of an aluminum gallium nitride layer and an aluminum nitride layer between the source and drain contacts and the substrate. These aluminum gallium nitride and aluminum nitride layers inhibit device performance capabilities because the aluminum gallium nitride layer and/or the aluminum nitride layer often have a high aluminum content that is greater than 25%.

Because the aluminum gallium nitride layer has a high aluminum content, the aluminum gallium nitride layer is a high band gap material. Additionally, the high aluminum content of the aluminum nitride layer makes the aluminum nitride layer a high impedance blocking layer. Accordingly, the high aluminum content causes one or more of a poor ohmic contact between the source and drain contacts and the at least one semiconductor layer, or poor two dimensional electron gas (2DEG) performance, which inhibits electron flow. As such, the high aluminum content in the aluminum gallium nitride layer and the aluminum nitride layer increases a resistance between the source and drain contacts and the at least one semiconductor layer, inhibiting device performance.

FIG. 1 is a cross-section view of a semiconductor device 100 with a low band gap material beneath a source contact and a drain contact of the semiconductor device 100, in accordance with one or more embodiments.

The semiconductor device 100 comprises a substrate 101, a first buffer layer 103 over the substrate 101, a second buffer layer 105 over the first buffer layer 103, a semiconductor layer 107 over the second buffer layer 105, an aluminum nitride layer 109 over the semiconductor layer 107, an aluminum gallium nitride layer 111 over the aluminum nitride layer 109, an indium gallium nitride layer 113 over the aluminum gallium nitride layer 111, a source contact 115 over a first portion 117 of the indium gallium nitride layer 113, a drain contact 119 over a second portion 121 of the indium gallium nitride layer 113, and a gate contact 123 between the source contact 115 and the drain contact 119. In some embodiments, the semiconductor device 100 optionally comprises a passivation layer 120 within which the source contact 115, drain contact 119 and gate contact 123 are deposited. In some embodiments, the semiconductor device 100 is a high mobility electron transistor.

A spacing within which the gate contact 123 resides separates the first portion 117 and the second portion 121 of the indium gallium nitride layer 113. The semiconductor device 100 also comprises a first blended region 125 beneath the first portion 117 of the indium gallium nitride layer 113 and a second blended region 127 beneath the second portion 121 of the indium gallium nitride layer 113.

The first blended region 125 and the second blended region 127 span at least the aluminum gallium nitride layer 111 and the aluminum nitride layer 109. The first blended region 125 and the second blended region 127 comprise aluminum atoms drawn from the aluminum nitride layer 109 into at least the aluminum gallium nitride layer 111. In some embodiments, the first blended region 125 and the second blended region 127 comprise indium atoms driven into at least the aluminum gallium nitride layer 111 from the indium gallium nitride layer 113. Driving the indium atoms from the aluminum gallium nitride layer 111 effectively replaces the high band gap material that is the aluminum gallium nitride layer 111, at least in the first blended region 125 and the second blended region 127, with a low band gap material, i.e., indium.

In some embodiments, the aluminum gallium nitride layer 111 comprises between about 15% and about 35% aluminum at least within the first blended region 125 and/or the second blended region 127.

In some embodiments, the indium gallium nitride layer 113 comprises between about 5% and about 20% indium. In other embodiments, the indium gallium nitride layer 113 comprises between about 9% and about 18% indium. In some embodiments, the indium gallium nitride layer 113 is an N-type doped material.

In some embodiments, the substrate 101 comprises one or more of a silicon, glass, polymer, metal, or other suitable material, the first buffer layer 103 comprises aluminum nitride, an oxide, a silicide, another nitride, or other suitable material, the second buffer layer 105 comprises aluminum gallium nitride, an oxide, a silicide, another nitride, or other suitable material. The first buffer layer 103 and the second buffer layer 105 have thicknesses that range between about 10 nm and about 200 nm.

In some embodiments, the semiconductor layer 107 comprises one or more materials other than aluminum such that the semiconductor layer 107 has 0% aluminum content. For example, the semiconductor layer 107 comprises gallium nitride, an oxide, a silicide, another nitride, or other suitable material. Though illustrated and discussed as one layer, the semiconductor layer 107, in some embodiments, the semiconductor layer 107 comprises two or more layers. For example, in some embodiments, the semiconductor layer 107 comprises a gallium nitride layer, and one or more aluminum nitride layers. If the semiconductor layer 107 comprises only gallium nitride, the semiconductor layer has a thickness ranging between about 0.5 micrometers to about 2 micrometers. If the semiconductor layer 107 comprises more than gallium nitride among one or more other layers, the one or more other layers that make up the semiconductor layer 107 individually have a thickness that ranges between about 10 nm and about 400 nm.

In some embodiments, the aluminum nitride layer 109 has a thickness ranging between about 1 nm and about 5 nm, the aluminum gallium nitride layer 111 has a thickness ranging between about 15 nm and about 30 nm, and the indium gallium nitride layer 113 has a thickness ranging between about 1 nm and about 5 nm.

In some embodiments, the source contact 115 and the drain contact 119 comprise an ohmic metal or alloy that comprises one or more of titanium, titanium disilicide, aluminum silicide, aluminum, titanium nitride, tungsten, molybdenum disilicide, platinum silicide, cobalt disilicide, tungsten disilicide, indium, gallium, palladium, gold, copper, tin, or other suitable material.

In some embodiments, the first blended region 125 and/or the second blended region 127 comprise atoms of at least one ohmic metal in the source contact 115 and/or the drain contact 119 driven into at least the aluminum gallium nitride layer 111 from the source contact 115 and/or the drain contact 119. For example, the first blended region 125 and/or the second blended region 127, in some embodiments, have titanium atoms driven into the aluminum gallium nitride layer 111 within the first blended region 125 and/or the second blended region 127.

Because the first blended region 125 and/or the second blended region 127 in the aluminum gallium nitride layer 111 comprise aluminum atoms drawn up from the aluminum nitride layer 109, the effective thickness of the aluminum nitride layer 109 is reduced compared to the aluminum nitride layer 109 before formation of the first blended region 125 and the second blended region 127. Also, because indium atoms driven into the aluminum gallium nitride layer 111 from the indium gallium nitride layer 113, the band gap of the aluminum gallium nitride layer 111 is lowered by the blending of indium atoms with the aluminum gallium nitride layer 111. The semiconductor device 100 having the first blended region 125 and the second blended region 127, accordingly, has a reduced resistance and improved ohmic performance between the source contact 115 and the drain contact 119 with the semiconductor layer 107 compared to conventional semiconductor devices.

Further, because some of the ohmic metal atoms of the source contact 115 and the drain contact 119 are driven into the aluminum gallium nitride layer 111 from the source contact 115 and the drain contact 119, the ohmic performance of the semiconductor device 100 is further improved because of the increased conductivity of the aluminum gallium nitride layer 111 on account of the addition of the ohmic metal atoms in the first blended region 125 and the second blended region 127.

Figure 2A:
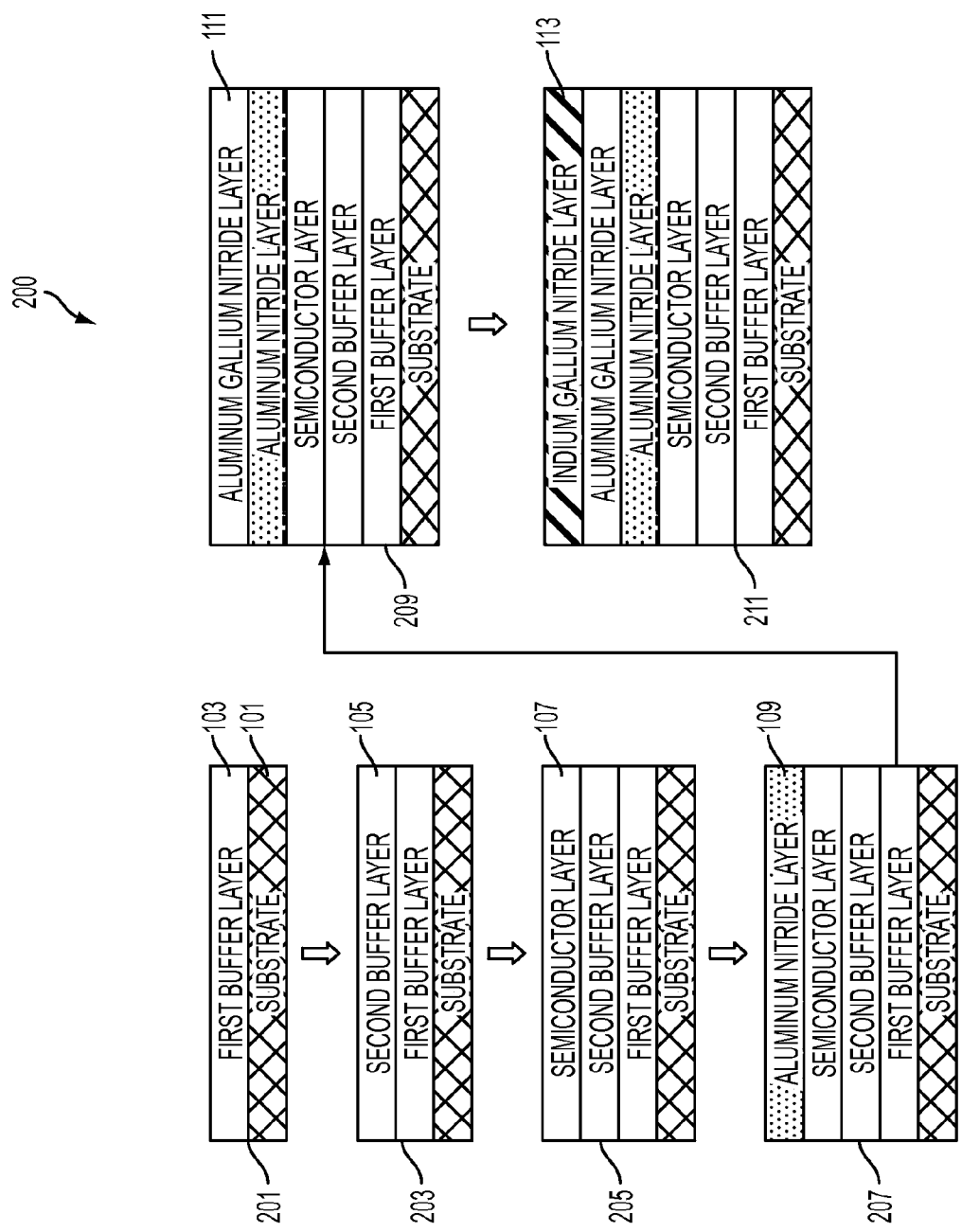
FIGS. 2a-2b are process diagrams of a method of manufacturing a semiconductor device, in accordance with one or more embodiments.
Figure 2B:
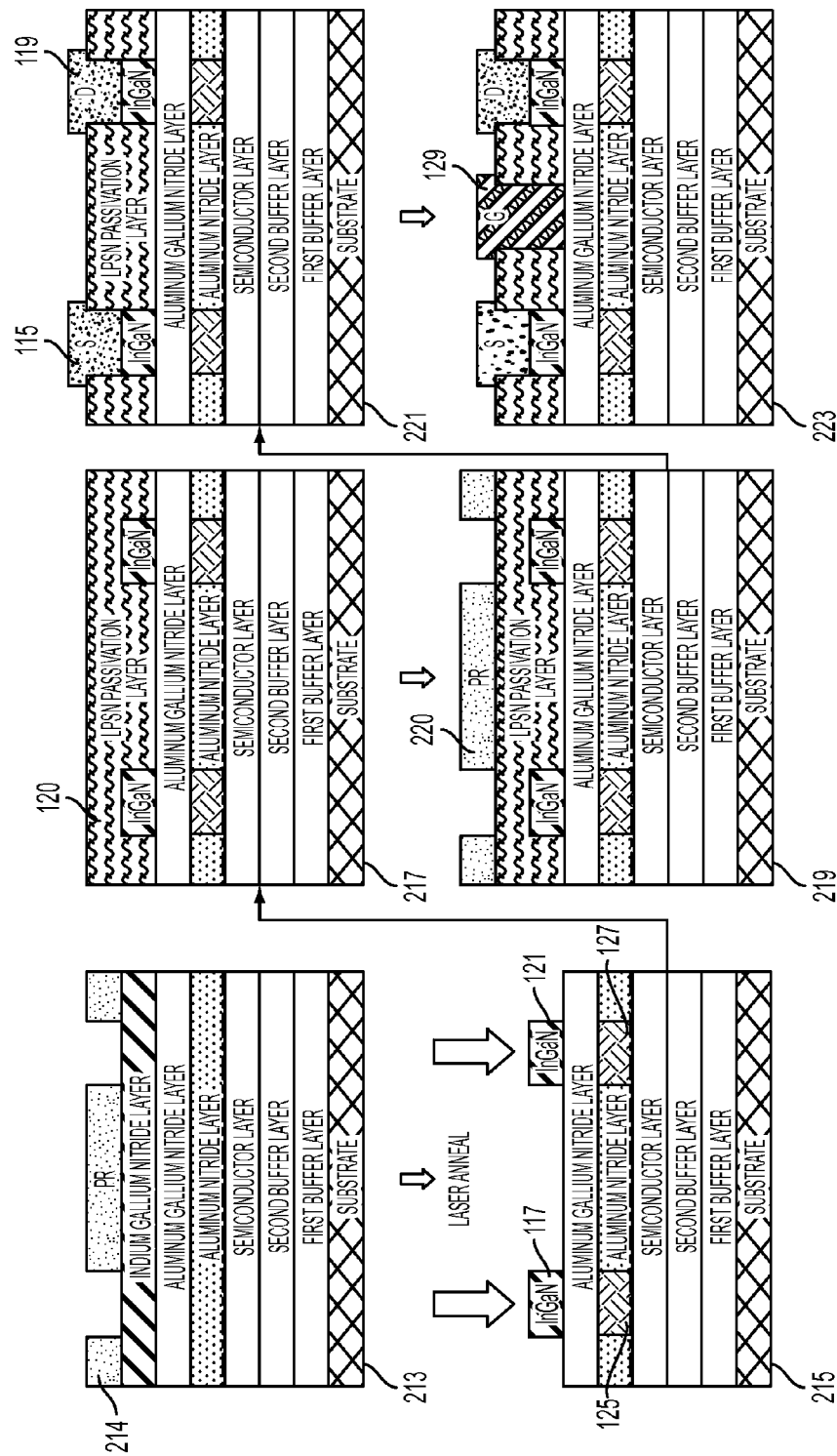

FIGS. 2a and 2b are process diagrams of a method 200 of manufacturing a semiconductor device such as semiconductor device 100 (FIG. 1), in accordance with one or more embodiments.

Method 200 starts in FIG. 2a with step 201 in which the first buffer layer 103 is deposited over the substrate 101 by a physical vapor deposition process (PVD), chemical vapor deposition process (CVD), metalorganic chemical vapor deposition process (MOCVD), an epitaxial growth process, a plating process, or other suitable process. In step 203, the second buffer layer 105 is deposited over the first buffer layer 103 by a PVD process, a CVD process, a MOCVD process, an epitaxial growth process, a plating process, or other suitable process. In step 205, the semiconductor layer 107 is deposited over the second buffer layer 105 by a PVD process, a CVD process, a MOCVD process, an epitaxial growth process, a plating process, or other suitable process. In step 207, the aluminum nitride layer 109 is deposited over the semiconductor layer 107 by a PVD process, a CVD process, a MOCVD process, an epitaxial growth process, a plating process, or other suitable process. In step 209, the aluminum gallium nitride layer 111 is deposited over the aluminum nitride layer 109 by a PVD process, a CVD process, a MOCVD process, an epitaxial growth process, a plating process, or other suitable process. In step 211, the indium gallium nitride layer 113 is deposited over the aluminum gallium nitride layer 111 by a PVD process, a CVD process, a MOCVD process, an epitaxial growth process, a plating process, or other suitable process.

Method 200 continues to FIG. 2b with step 213, in which a first patterned photo resist 214 is deposited or applied over the indium gallium nitride layer 113 and some of the indium gallium nitride layer 113 is removed by, for example, a lithography or etching process, leaving the first portion 117 of the indium gallium nitride layer 113 and the second portion 121 of the indium gallium nitride layer 113.

In step 215, an aluminum content of at least the aluminum nitride layer 109 is reduced by drawing aluminum atoms from the aluminum nitride layer 109 into at least the aluminum gallium nitride layer 111 beneath the first portion 117 and the second portion 121 of the indium gallium nitride layer 113. In some embodiments, the aluminum content of the aluminum nitride layer 109 is reduced by laser annealing at least the first portion 117 and the second portion 121 of the indium gallium nitride layer 113. Additionally, in step 215, at least some indium atoms from the indium gallium nitride layer 113 are driven into at least the aluminum gallium nitride layer 111 beneath the first portion 117 and the second portion 121 of the indium gallium nitride layer 113.

In step 217, the passivation layer 120 is deposited over the aluminum gallium nitride layer 111, the first portion 117 of the indium gallium nitride layer 113, and the second portion 121 of the indium gallium nitride layer 113 by a PVD process, a CVD process, a MOCVD process, an epitaxial growth process, a plating process, or other suitable process.

In step 219, a second patterned photo resist 220 is deposited or applied over the passivation layer 120, and portions of the passivation layer 120 over the first portion 117 of the indium gallium nitride layer 113 and the second portion 121 of the indium gallium nitride layer 113 are removed by a lithography or etching process.

In step 221, source contact 115 is deposited over the first portion 117 of the indium gallium nitride layer 113 and drain contact 119 is deposited over the second portion 121 of the indium gallium nitride layer 113 within a space that remains following removal of the portions of the passivation layer 120 in step 219. The source contact 115 and the drain contact 119 are deposited by a PVD process, a CVD process, a MOCVD process, an epitaxial growth process, a plating process, or other suitable process.

In step 223, another portion of the passivation layer 120 is removed between the first portion 117 of the indium gallium nitride layer 113 and the second portion 121 of the indium gallium nitride layer 113 exposing the aluminum gallium nitride layer 111. The gate contact 123 is then deposited within a gap that remains following removal of the another portion of the passivation layer 120 such that the gate contact 123 is over the aluminum gallium nitride layer 111 between the source contact 115 and the drain contact 119.

Optionally, in one or more of step 221 or step 223, at least some atoms of at least one ohmic metal in the source contact 115 and the drain contact 119 into at least the aluminum gallium nitride layer 111 annealing the source contact 115 and the drain contact 119. In some embodiments, the annealing of the source contact 115 and the drain contact 119 is an alloy annealing process that is conducted for about 30 to about 90 seconds at a temperature ranging between about 700° C. and about 900° C. In some embodiments, the alloy annealing process is conducted for about 60 seconds at a temperature greater than about 800° C. or about 850° C. In some embodiments, the source contact 115 and/or the drain contact 119 are laser annealed.

An aspect of this description is related to a semiconductor device. The semiconductor device comprises a substrate, a first layer comprising aluminum nitride over the substrate, a second layer comprising aluminum gallium nitride over the first layer, and a third layer comprising indium gallium nitride over the second layer. The third layer has a first portion and a second portion. The first portion of the third layer is separated from the second portion of the third layer. The semiconductor device also comprises a first blended region beneath the first portion of the third layer. The first blended region comprises aluminum atoms drawn from the first layer into at least the second layer. The semiconductor device further comprises a second blended region beneath the second portion of the third layer. The second blended region comprises aluminum atoms drawn from the first layer into at least the second layer. The semiconductor device additionally comprises a source contact over the first portion of the third layer and a drain contact over the second portion of the third layer.

Another aspect of this description is related to a semiconductor device. The semiconductor device comprises an aluminum nitride (AlN) layer, an aluminum gallium nitride (AlGaN) layer over the AlN layer, a first indium gallium nitride (InGaN) structure over the AlGaN layer, and a second InGaN structure over the AlGaN layer. The second InGaN structure is separated from the first InGaN structure. The semiconductor device also comprises a first blended region beneath the first InGan structure. The first blended region comprises aluminum atoms drawn from the AlN layer into at least the AlGaN layer. The semiconductor device further comprises a second blended region beneath the second InGaN structure. The second blended region comprises aluminum atoms drawn from the AlN layer into at least the AlGaN layer. The semiconductor device additionally comprises a source contact over the first InGaN structure, and a drain contact over the second InGaN structure.

A further aspect of this description is related to a semiconductor device. The semiconductor device comprises a first layer comprising aluminum nitride, a second layer comprising aluminum gallium nitride over the first layer, and a third layer comprising indium gallium nitride over the second layer. The third layer has a first portion and a second portion. The first portion of the third layer is separated from the second portion of the third layer. The semiconductor device also comprises a first annealed region beneath the first portion of the third layer. The first annealed region comprises aluminum atoms drawn from the first layer into at least the second layer. The semiconductor device further comprises a second annealed region beneath the second portion of the third layer. The second annealed region comprises aluminum atoms drawn from the first layer into at least the second layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a first layer comprising aluminum nitride over the substrate;
   a second layer comprising aluminum gallium nitride over the first layer;
   a third layer comprising indium gallium nitride over the second layer, the third layer having a first portion and a second portion, the first portion of the third layer being separated from the second portion of the third layer;
   a first blended region beneath the first portion of the third layer, the first blended region comprising aluminum atoms drawn from the first layer into at least the second layer;
   a second blended region beneath the second portion of the third layer, the second blended region comprising aluminum atoms drawn from the first layer into at least the second layer;
   a source contact over the first portion of the third layer; and
   a drain contact over the second portion of the third layer.

2. The semiconductor device of claim 1, wherein the third layer comprises between about 5% and about 20% indium.

3. The semiconductor device of claim 1, wherein the first layer is over at least one layer having 0% aluminum content.

4. The semiconductor device of claim 1, wherein the first layer has a first thickness ranging between about 1 nanometer (nm) and about 5 nm, the second layer has a second thickness ranging between about 15 nm and about 30 nm, and the third layer has a third thickness ranging between about 1 nm and about 5 nm.

5. The semiconductor device of claim 1, wherein the second layer comprises between about 15% and about 35% aluminum.

6. The semiconductor device of claim 1, wherein the source contact and the drain contact comprise an ohmic metal.

7. The semiconductor device of claim 6, wherein the first blended region and the second blended region comprise atoms of at least one ohmic metal in the source contact and the drain contact driven into at least the second layer from the source contact and the drain contact.

8. The semiconductor device of claim 1, wherein the first blended region and the second blended region comprise indium atoms driven into at least the second layer from the third layer.

9. The semiconductor device of claim 1, further comprising:
 a passivation layer over the second layer and between the first portion of the third layer and the second portion of the third layer.

10. The semiconductor device of claim 1, further comprising:
 a gate contact between the source contact and the drain contact.

11. The semiconductor device of claim 10, wherein the gate contact is over the second layer.

12. The semiconductor device of claim 11, wherein the gate contact is in direct physical contact with the second layer.

13. A semiconductor device comprising:
 an aluminum nitride (AlN) layer;
 an aluminum gallium nitride (AlGaN) layer over the AlN layer;
 a first indium gallium nitride (InGaN) structure over the AlGaN layer;
 a second InGaN structure over the AlGaN layer, the second InGaN structure being separated from the first InGaN structure;
 a first blended region beneath the first InGan structure, the first blended region comprising aluminum atoms drawn from the AlN layer into at least the AlGaN layer;
 a second blended region beneath the second InGaN structure, the second blended region comprising aluminum atoms drawn from the AlN layer into at least the AlGaN layer;
 a source contact over the first InGaN structure; and
 a drain contact over the second InGaN structure.

14. The semiconductor device of claim 13, wherein an indium concentration of one or more of the first InGan structure or the second InGaN structure is independently in a range from about 5% to about 20%.

15. The semiconductor device of claim 13, wherein the AlN layer is over a semiconductor layer.

16. The semiconductor device of claim 13, wherein the source contact and the drain contact comprise an ohmic metal.

17. The semiconductor device of claim 16, wherein the first blended region or the second blended region is an annealed region that comprises atoms of the ohmic metal in the source contact or the drain contact driven into at least the AlGaN layer from the source contact or the drain contact.

18. The semiconductor device of claim 13, wherein the first blended region or the second blended region is an annealed region that comprises indium atoms driven into at least the AlGaN layer from the first InGaN structure or the second InGaN structure.

19. A semiconductor device comprising:
 a first layer comprising aluminum nitride;
 a second layer comprising aluminum gallium nitride over the first layer;
 a third layer comprising indium gallium nitride over the second layer, the third layer having a first portion and a second portion, the first portion of the third layer being separated from the second portion of the third layer;
 a first annealed region beneath the first portion of the third layer, the first annealed region comprising aluminum atoms drawn from the first layer into at least the second layer; and
 a second annealed region beneath the second portion of the third layer, the second annealed region comprising aluminum atoms drawn from the first layer into at least the second layer.

20. The semiconductor device of claim 19, further comprising:
 a source contact over the first portion of the third layer;
 a drain contact over the second portion of the third layer; and
 a gate contact over the second layer, and between the first portion of the third layer and the second portion of the third layer.

* * * * *